(12) United States Patent
Kim

(10) Patent No.: US 7,326,632 B2
(45) Date of Patent: Feb. 5, 2008

(54) METHOD FOR FABRICATING METAL WIRINGS OF SEMICONDUCTOR DEVICE

(75) Inventor: Jea-Hee Kim, Yeoju-kun (KR)

(73) Assignee: Dongbu Electronics Co., Ltd., Seoul (KR)

( * ) Notice: Subject to any disclaimer, the term of this patent is extended or adjusted under 35 U.S.C. 154(b) by 152 days.

(21) Appl. No.: 11/025,989

(22) Filed: Jan. 3, 2005

(65) Prior Publication Data

US 2005/0142860 A1    Jun. 30, 2005

(30) Foreign Application Priority Data

Dec. 31, 2003    (KR) ............... 10-2003-0101820

(51) Int. Cl.
*H01L 21/20* (2006.01)
(52) U.S. Cl. .............. 438/584; 438/622; 438/626; 438/687; 257/E21.627
(58) Field of Classification Search ........ 438/584, 438/622, 626, 687
See application file for complete search history.

(56) References Cited

U.S. PATENT DOCUMENTS 5,834,356 A * 11/1998 Bothra et al. .......... 438/384
6,211,051 B1 * 4/2001 Jurgensen et al. ...... 438/597
2004/0100779 A1 * 5/2004 Kraft ..................... 361/760
2005/0164467 A1 * 7/2005 Lim et al. ............... 438/400

FOREIGN PATENT DOCUMENTS

| KR | 2001-0076659 | 8/2001 |
| KR | 2003-0043025 | 6/2003 |

* cited by examiner

*Primary Examiner*—Asok K. Sarkar
*Assistant Examiner*—Victor V. Yevsikov
(74) *Attorney, Agent, or Firm*—Lowe Hauptman Ham & Berner LLP

(57) ABSTRACT

A method for fabricating metal wirings of a semiconductor including forming an etch stop layer on a semiconductor substrate, and forming an inter metal dielectric on the etch stop layer. The method also includes forming a via hole in the inter metal dielectric so as to expose the etch stop layer, and forming a trench on the inter metal dielectric so as to expose the via hole. The method further includes removing the etch stop layer exposed through the via hole, wet etching an inner wall of the trench, and forming a metal wiring inside the via hole and the trench.

10 Claims, 2 Drawing Sheets

METHOD FOR FABRICATING METAL WIRINGS OF SEMICONDUCTOR DEVICE

BACKGROUND OF THE INVENTION (a) Field of the Invention

The present invention relates to a method for fabricating metal wirings of a semiconductor device and, in particular, to a method for fabricating the metal wirings of the semiconductor device having a damascene structure.

(b) Description of the Related Art

Recently, as semiconductor devices have been highly integrated and process techniques have been enhanced, conventional aluminum wirings are being replaced by copper wirings for improving the device characteristics such as operation speed and resistance of the device, and parasitic capacitance between the wirings.

However, since copper has very poor etching characteristics, a damascene process replaces the conventional etching process.

In the damascene process, a dual damascene pattern having trenches for forming via holes and wirings in an inter metal dielectric is formed, and then a copper layer is deposited thickly enough to fill the contact holes. After forming the dual damascene pattern, an annealing process is performed on the copper layer so as to remove the impurities that are included during the deposition of the copper layer. The polishing process is carried out on the upper surface of the inter metal dielectric using a chemical mechanical polishing technique, thereby forming the metal wirings and plugs.

Because the via holes and trenches are filled with metal, the edges of the via holes and the trenches are formed with a rounded shape so as to increase the step coverage.

However, during the etching process for forming the via holes and the trenches, inner walls of the trenches develop a striated profile due to the reflectivity difference between the inter metal dielectric layer and the etch stop layer. Such striations deteriorate the step coverage of the metal layer formed inside the trench.

Also, the striations generate a gap between a thin film deposited on the inner walls of the trench and the surface of the trench, which causes problems during the planarization process, resulting in cracking of the thin film. Such defects are common in regions where the metal wirings are crowded.

SUMMARY OF THE INVENTION

The present invention has been made in an effort to solve the above problems. The present invention advantageously provides a method for fabricating a semiconductor device, which is capable of closely depositing the thin film by minimizing the occurrence of the striation effect.

In order to achieve the above advantage, the method for fabricating metal wirings of a semiconductor according to the present invention includes forming an etch stop layer on a semiconductor substrate, forming an inter metal dielectric on the etch stop layer, forming a via hole in the inter metal dielectric so as to expose the etch stop layer, forming a trench on the inter metal dielectric so as to expose the via hole, removing the etch stop layer exposed through the via hole, wet-etching an inner wall of the trench, and forming a metal wiring filled inside the via hole and the trench. The method can further include a step of thermally treating the substrate in an environment of heavy hydrogen after the wet etching process.

In an exemplary embodiment, the wet etching process is performed with an etchant made by mixing alkalic solution, $H_2O_2$, and distilled water in a ratio of 1:4:about 4 to about 20.

In an exemplary embodiment, the alkalic solution is ammonium or TMAH.

In an exemplary embodiment, the wet etching is performed until the inter metal dielectric is removed as much as about 10 to about 20 Å.

In an exemplary embodiment, the wet etching is performed at a temperature in the range of about 30 to about 45° C.

In an exemplary embodiment, the thermal treatment is performed for about 10 to about 30 seconds at a temperature in the range of about 200 to about 300° C.

In an exemplary embodiment, the semiconductor substrate includes a low metal wiring and the metal wiring is connected to the low metal wiring through the via hole and the trench.

It is to be understood that both the foregoing general description of the invention and the following detailed description are exemplary, but are not restrictive of the invention.

DETAILED DESCRIPTION OF THE INVENTION

Figure 1:
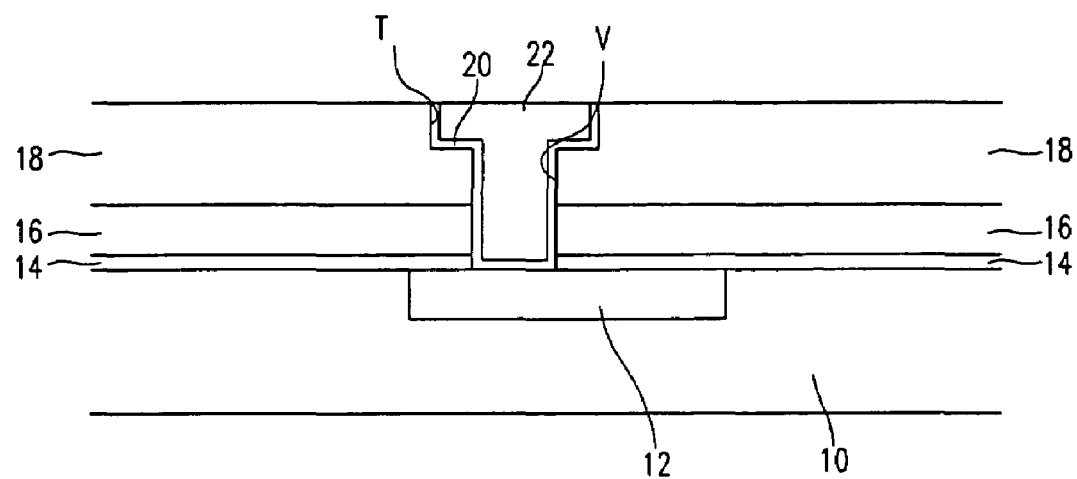
FIG. 1 is a cross sectional view illustrating a metal wiring of the semiconductor device according to an exemplary embodiment of the present invention.

With reference to the accompanying drawings, the present invention will be described in order those skilled in the art to be able to implement. However, the invention is not limited to the embodiments to be described hereinafter, but, to the contrary, is intended to cover various modification and equivalent arrangements included within the sprit and scope of the appended claims.

To clarify multiple layers and regions, the thickness of the layers are enlarged in the drawings. Wherever possible, the same reference numbers will be used throughout the drawing(s) to refer to the same or like parts. When it is said any part such as a layer, film, area, or plate is positioned "on" another part, it means the part is right on the other part or above the other part with at least one intermediate part. Further, when it is said that any part is positioned "right on" another part, it means that there is no intermediate part between the two parts (i.e. the parts are in direct contact).

A semiconductor device according to an exemplary embodiment of the present invention will be described in detail hereinafter with reference to the accompanying drawings.

FIG. 1 is a cross sectional view illustrating a metal wiring of the semiconductor device according to an exemplary embodiment of the present invention.

Referring to FIG. 1, an etch stop layer 14 is formed on a semiconductor substrate 10 in which low metal structures, such as metal wirings 12, and inter metal dielectrics 16 and 18 are formed. The inter metal dielectrics 16 and 18 are formed by depositing oxide material in a single or dual layered structure. The inter metal dielectrics are preferably made from a fluorine silicate glass (FSG), a plasma based SiH$_4$ (P—SiH$_4$), and the like.

The inter metal dielectrics 16 and 18 are provided with metal wirings 20 and 22 formed by filling via holes and trenches, which connect the upper and lower wirings and circuits.

The metal wirings 20 and 22 are comprised of a diffusion protection layer 20 formed on the inner walls of the via hole (V) and the trench (T), and a metal layer 22 which fills the via hole and trench defined by the diffusion protection layer. The diffusion protection layer 20 is made from tantalum silicon nitride (TaSiN), and the metal layer 22 is made from a conductive layer such as copper (Cu), a low resistance metal.

A method for fabricating the metal wirings of the semiconductor device according to an exemplary embodiment of the present invention will be described in detail hereinafter with reference to FIG. 2 to FIG. 4.

Figure 2:
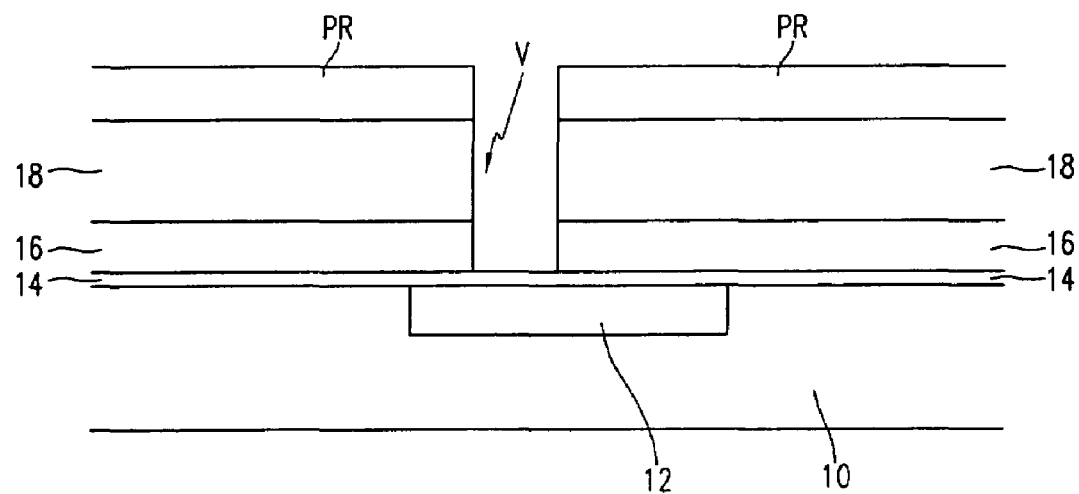
FIG. 2 to FIG. 4 are cross-sectional views illustrating fabrication steps of the metal wirings of the semiconductor device according to an exemplary embodiment of the present invention.
Figure 3:
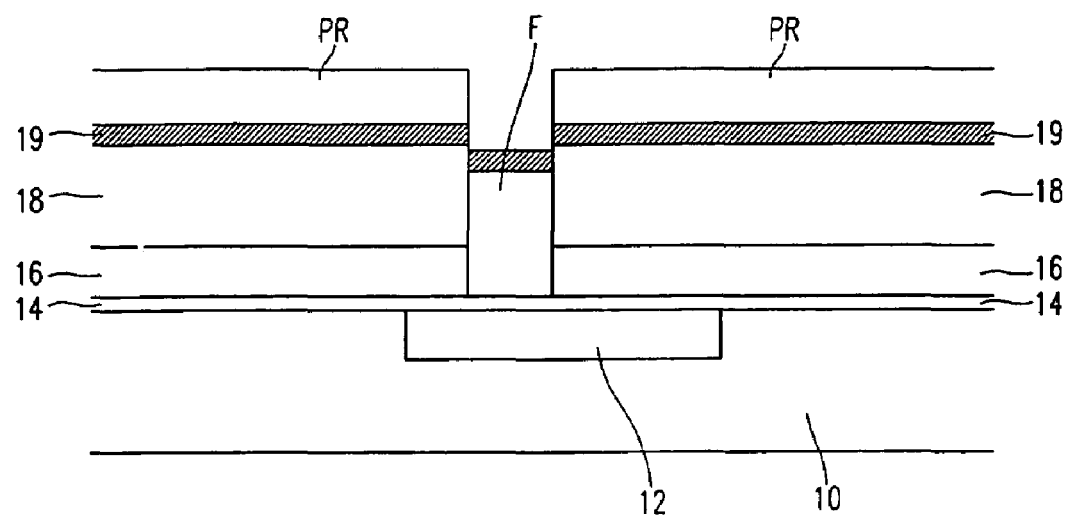
Figure 4:
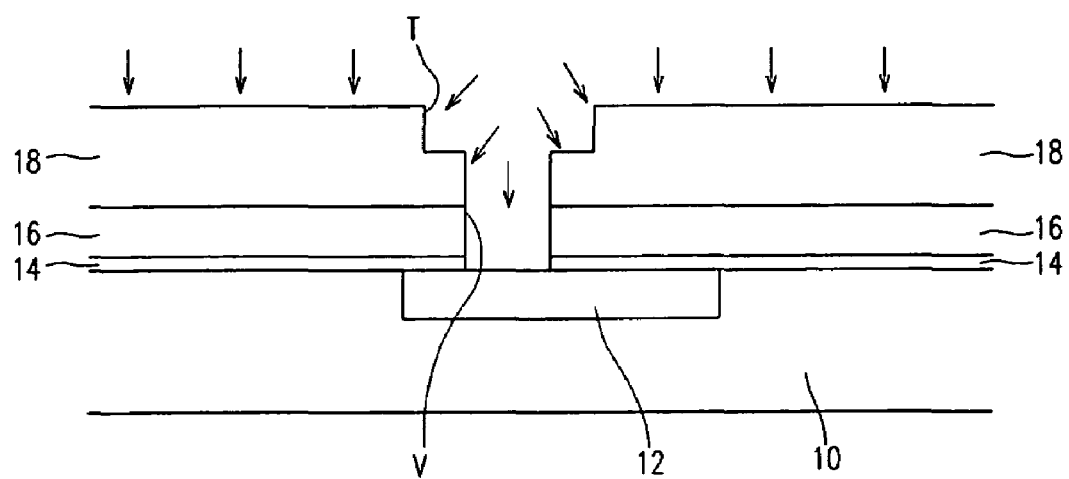

FIG. 2 to FIG. 4 are cross-sectional views illustrating fabrication steps of the metal wirings of the semiconductor device according to an exemplary embodiment of the present invention.

Referring to FIG. 2, an etch stop layer 14 is formed by depositing a material such as silicon nitride on a semiconductor substrate 10 which has low metal structures such as metal wiring 12 thereon. An inter metal dielectric layer is formed in a single or multiple layered structure by depositing inorganic material or low conductive material.

In an exemplary embodiment, the inter metal dielectric layer is formed in a dual layered structure by depositing a P—SiH$_4$ as a first inter metal dielectric layer 16, and depositing the FSG as a second inter metal dielectric layer 18 on the first inter metal dielectric layer 16.

Next, a photoresist pattern (PR) is formed on the second inter metal dielectric layer 18, the photoresist pattern defining a via hole. The via hole (V) is formed by etching until the etch stop layer 14 is exposed using the photoresist pattern (PR) as a mask.

Referring to FIG. 3, the via hole (V) is filled with resin or photoresist so as to form a dummy layer (F). The dummy layer (F) is supports a bottom antireflective coating (BARC) 19 to be deposited in the following process in a planar manner. If the BARC 19 is not planar, it is difficult to form the photoresist pattern (PR) in a desired pattern on the BARC 19.

An antireflective layer 19 is formed on the substrate 10 including the dummy layer (F) by depositing organic or inorganic material. The antireflective layer 19 absorbs the light so as to prevent the photoresist from being damaged by the scattered reflection of the light during the photolithography process.

Referring to FIG. 4, the photoresist pattern defining a trench is formed on the antireflective layer 19. The trench (T) is formed by selectively etching the second inter metal dielectric 18 to expose the via hole (V) using the photoresist pattern (PR) as a mask. Next, the etch stop layer 14 is removed to expose the metal wirings 12.

At this time, striations (not shown) can form on the inner walls of the trench (T). The striations are removed through an etching process after the trench is formed.

The second inter metal dielectric 18 is etched using the wet etch technique, in which the substrate 10 is dipped into an etchant at about 30 to about 40° C., until the thickness of the second inter metal dielectric 18 is removed as much as about 10 to about 20 Å. The wet etch is an isotropic etch which etches out the protruded portions of the striations more than other portions, such that the entire surface of the inner wall of the trench is a plane.

The second inter metal dielectric 18 is not etched well in an etchant with a temperature less than the proposed range. On the other hand if the temperature is greater than the proposed temperature, the second inter metal dielectric 18 is excessively etched such that the critical dimension (CD) of the metal wiring can be changed. The etchant is made by mixing ammonia or trimethyl ammonium hydroxide (TMAH), H$_2$O$_2$, and deionized (D.I.) water in a ratio of 1:4:about 4 to about 20.

Next, the substrate 10 is thermally treated in an environment of heavy hydrogen (D$_2$) at a temperature in the range of about 200 to about 300° C. for about 10 to about 30 seconds. By performing the thermal treatment, the polymer particles existing in the lower metal wirings or inner walls of the trench react with the hydrogen and are removed.

Referring to FIG. 1, on the inner walls of the via hole (V) and the trench (T), the first metal layer is formed by depositing metal such as titanium or titanium alloy. A second metal layer is formed so as to fill the via hole and the trench defined by the first metal layer. The second metal layer is made from a low resistance metal such as copper.

Finally, a polishing process is carried out using a chemical mechanical polishing technique until the upper surface of the second inter metal dielectric is exposed such that the metal wirings 20 and 22 are formed inside the via hole and the trench.

As described above, in the present invention the striations formed on the inner wall of the trench are effectively removed through an etching process such that it is possible to avoid occurrence of a gap between the thin layer and the inner wall of the trench in a thin film deposition process.

Korean Patent Application No. 10-2003-0101820, filed on Dec. 31, 2003, is incorporated herein by reference in its entirety.

Although exemplary embodiments of the present invention have been described in detail hereinabove, it should be clearly understood that many variations and/or modifications of the basic invention concepts herein taught which may appear to those skilled in the present art will still fall within the spirit and scope of the present invention, as defined in the appended claims.

What is claimed is:

1. A method for fabricating metal wirings of a semiconductor, comprising:

forming an etch stop layer on a semiconductor substrate;

forming an inter metal dielectric on the etch stop layer;

forming a via hole in the inter metal dielectric so as to expose the etch stop layer;

forming a trench on the inter metal dielectric so as to expose the via hole;

removing the etch stop layer exposed through the via hole;

removing any striations formed on an inner wall of the trench;

thermally treating the semiconductor substrate in an environment of heavy hydrogen at a temperature in the range of 200 to 300 degrees Celsius for 10 to 30 seconds after the removing of any striations so as to remove polymer particles existing in the inner walls of the trench; and forming a metal wiring filled inside the via hole and the trench;

wherein removing any striations includes wet etching in an etchant made by mixing alkalic solution, H2O2, and distilled water in a ratio of 1:4:4 to 20, at a temperature in a range of about 30 to about 45 degrees Celsius.

2. The method of claim 1, wherein the alkalic solution is ammonium or TMAH.

3. The method of claim 1, wherein the step of removing any striations includes wet etching until a depth of the inter metal dielectric removed is between about 10 to about 20 Å.

4. The method of claim 1, wherein the semiconductor substrate includes a low metal wiring and the metal wiring is connected to the low metal wiring through the via hole and the trench.

5. A method for fabricating metal wirings of a semiconductor, compnsing:
   a step for forming an etch stop layer on a semiconductor substrate;
   a step for forming an inter metal dielectric on the etch stop layer;
   a step for forming a via hole in the inter metal dielectric so as to expose the etch stop layer;
   a step for forming a trench on the inter metal dielectric so as to expose the via hole;
   a step for removing the etch stop layer exposed through the via hole;
   a step for removing any striations formed on an inner wall of the trench;
   a step for thermally treating the substrate in an environment of heavy hydrogen at a temperature in a range of 200 to 300 degrees Celsius for 10 to 30 seconds after the step for removing striations formed on the inner wall of the trench so as to remove polymer particles existing in the inner wall of the trench; and
   a step for forming a metal wiring filled inside the via hole and the trench;
   wherein removing any striations includes wet etching in an etchant made by mixing alkalic solution, H2O2, and distilled water in a ratio of 1:4:4 to 20, at a temperature in a range of about 30 to about 45 degrees Celsius.

6. The method of claim 5, wherein the alkalic solution is ammonium or TMAH.

7. The method of claim 5, wherein the step for removing any striations includes a step for wet etching until a depth of the inter metal dielectric removed is between about 10 to about 20 Å.

8. The method of claim 5, wherein the semiconductor substrate includes a low metal wiring and the metal wiring is connected to the low metal wiring through the via hole and the trench.

9. The method of claim 1, wherein the step of removing any striations includes wet etching.

10. The method of claim 5, wherein the step for removing any striations includes a step for wet etching.

* * * * *